(12) United States Patent  
Liou et al.

(10) Patent No.: US 10,319,641 B2  
(45) Date of Patent: Jun. 11, 2019

(54) SEMICONDUCTOR DEVICE HAVING GATE STRUCTURE

(71) Applicant: UNITED MICROELECTRONICS CORP., Hsin-Chu (TW)

(72) Inventors: En-Chiuan Liou, Tainan (TW); Chao-Hung Lin, Changhua County (TW); Yu-Cheng Tung, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/127,241

(22) Filed: Sep. 11, 2018

(65) Prior Publication Data

US 2018/0374757 A1 Dec. 27, 2018

Related U.S. Application Data

(62) Division of application No. 14/814,516, filed on Jul. 31, 2015, now Pat. No. 10,103,062.

(30) Foreign Application Priority Data

Jul. 1, 2015 (CN) .......................... 2015 1 0376711

(51) Int. Cl.
| | |
|---|---|
| *H01L 21/8234* | (2006.01) |
| *H01L 21/762* | (2006.01) |
| *H01L 27/088* | (2006.01) |
| *H01L 21/308* | (2006.01) |
| *H01L 29/06* | (2006.01) |

(Continued)

(52) U.S. Cl.  
CPC ........... *H01L 21/823481* (2013.01); *H01L 21/28123* (2013.01); *H01L 21/3086* (2013.01); *H01L 21/762* (2013.01); *H01L 21/76232* (2013.01); *H01L 21/823431* (2013.01); *H01L 27/0886* (2013.01); *H01L 29/0649* (2013.01); *H01L 29/66795* (2013.01)

(58) Field of Classification Search  
CPC .................................................. H01L 21/8234  
See application file for complete search history.

(56) References Cited

U.S. PATENT DOCUMENTS

| | | |
|---|---|---|
| 7,994,020 B2 | 8/2011 | Lin |
| 8,828,885 B2 | 9/2014 | Lee |
| 8,951,918 B2 | 2/2015 | Li |

(Continued)

OTHER PUBLICATIONS

Tseng, Title of Invention: FinFET Having a Trench in the Fin Shaped Structure, U.S. Appl. No. 14/684,445, filed Apr. 13, 2015.

*Primary Examiner* — Marvin Payen  
(74) *Attorney, Agent, or Firm* — Winston Hu

(57) ABSTRACT

A semiconductor device includes a substrate, a first insulating structure and a gate structure. The substrate includes at least two fin structures protruding from a top surface of the substrate, the substrate includes a first recess and a second recess under the first recess, and the first recess and the second recess are disposed between the fin structures, in which a width of the first recess is larger than a width of the second recess, and the first recess and the second recess form a step structure. The first insulating structure fills the second recess. The gate structure is disposed on the first insulating structure, in which the first recess and the second recess are filled up with the gate structure and the first insulating structure.

6 Claims, 10 Drawing Sheets

(51) Int. Cl.
*H01L 21/28* (2006.01)
*H01L 29/66* (2006.01)

(56) References Cited

U.S. PATENT DOCUMENTS

2015/0047891 A1 2/2015 Lee
2015/0050792 A1 2/2015 Samavedam

SEMICONDUCTOR DEVICE HAVING GATE STRUCTURE

CROSS REFERENCE TO RELATED APPLICATIONS

This application is a divisional application of and claims the benefit of U.S. patent application Ser. No. 14/814,516, filed Jul. 31, 2015.

BACKGROUND OF THE INVENTION

1. Field of the Invention

The present invention relates to a semiconductor device having a gate structure, and more particularly, to a method for fabricating a semiconductor device having a gate structure, which forms a cutting trench to expose a substrate before forming mandrel patterns.

2. Description of the Prior Art

With the trend in the industry being towards scaling down the size of the transistors, non-planar transistor device, such as fin field effect transistor (FinFET) device, has been developed to replace planar transistors to overcome process limits.

The processes of the FinFET device can be integrated with the traditional processes of the logic device, the processes of the FinFET device have good compatibility. More importantly, because the three-dimensional structure of the FinFET device increases the overlapping area between the gate and the fin structure of the silicon substrate, the channel region can therefore be more effectively controlled. This way, the channel region is also longer for an equivalent gate length, and thus the current between the source and the drain is increased.

Although the FinFET device can have more drain current when the size is reduced, some defects in the current FinFET device still exist. For example, the insulating structure of the FinFET device also affects the number of the transistors contained by the whole FinFET device. Hence, how to improve the current FinFET process for resolving this issue has become an important task in this field.

SUMMARY OF THE INVENTION

It is one of the objectives of the present invention to provide a semiconductor device having a gate structure and a method for fabricating the same to reduce the width of the insulating structure between the transistors.

According to an embodiment of the present invention, a method for fabricating a semiconductor device having a gate structure is provided. First, a substrate and a mandrel layer are provided, wherein the substrate, the hard mask layer and the mandrel layer are stacked sequentially. Next, a cutting trench is formed in the mandrel layer, wherein the cutting trench penetrates through the mandrel layer and exposes the substrate. Thereafter, the mandrel layer is patterned to form a plurality of mandrel patterns and removing a part of the substrate through the cutting trench to form a first recess on the substrate. Subsequently, a spacer is formed on sidewalls of the mandrel patterns and a sidewall of the first recess and followed by removing the mandrel layer. Later, an etching process is performed, using the spacer as a mask, to form a second recess under the first recess, wherein the first recess and the second recess form a step structure. After that, the spacer is removed and followed by forming a first insulating structure in the second recess. Then, a gate structure is formed on the first insulating structure.

According to another embodiment of the present invention, a semiconductor device having a gate structure is provided. The semiconductor device includes a substrate, a first insulating structure and a gate structure. The substrate includes at least two fin structures protruding from a top surface of the substrate, the substrate has a first recess and a second recess under the first recess, and the first recess and the second recess are disposed between the fin structures, wherein a width of the first recess is larger than a width of the second recess, and the first recess and the second recess form a step structure. The first insulating structure fills the second recess. The gate structure is disposed on the first insulating structure, wherein the first recess and the second recess are filled up with the gate structure and the first insulating structure.

According to another embodiment of the present invention, a method for fabricating a semiconductor device having a gate structure is provided. First, a substrate comprising at least two fin structures protruding from a top surface of the substrate is formed, the substrate includes a first recess and a second recess under the first recess, and the first recess and the second recess are disposed between the fin structures, wherein a width of the first recess is larger than a width of the second recess, and the first recess and the second recess form a step structure. Then, a first insulating structure is formed in the second recess and followed by forming a gate structure on the first insulating structure, wherein the first recess and the second recess are filled up with the gate structure and the first insulating structure.

In the method for fabricating the semiconductor device of the present invention, since the cutting trench is formed before forming the mandrel patterns, the first spacer portion can be formed on the sidewall of the first recess. Accordingly, the width of the formed second recess can be smaller than the width of the first recess, and the width of the first insulating structure formed in the second recess can be reduced. Thus, the transistors disposed at two sides of the first insulating structure can have a smaller gap therebetween, thereby increasing the density of the transistors in the semiconductor device.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred embodiments will be detailed as follows. The preferred embodiments of the present invention are illustrated in the accompanying drawings with numbered elements to elaborate the contents and effects to be achieved.

Figure 1:
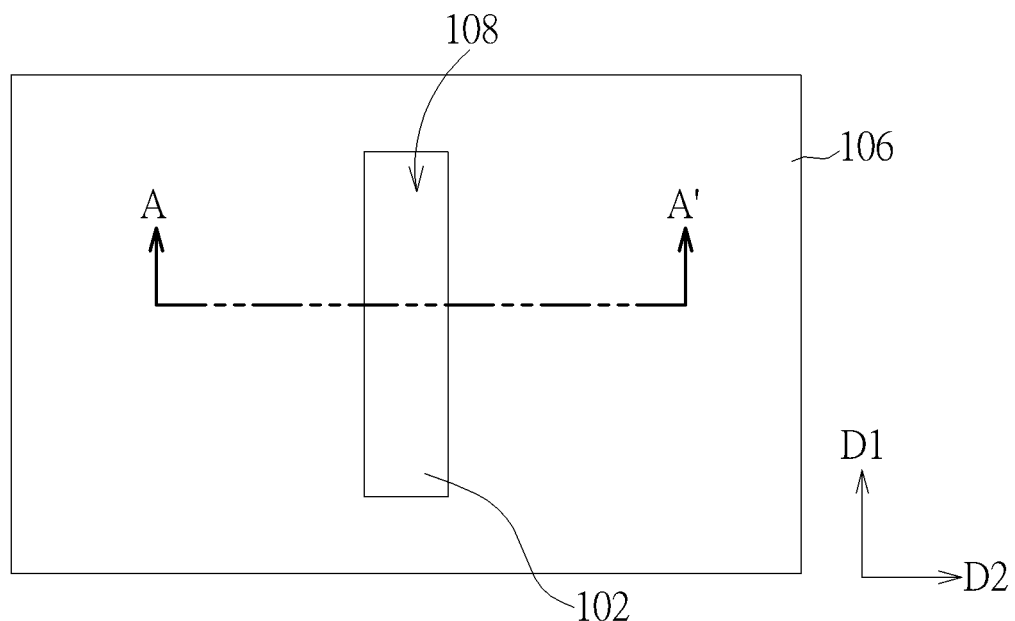
FIG. 1 through FIG. 18, which are schematic diagrams illustrating a method for fabricating a semiconductor device having a gate structure according to a first embodiment of the present invention.
Figure 2:
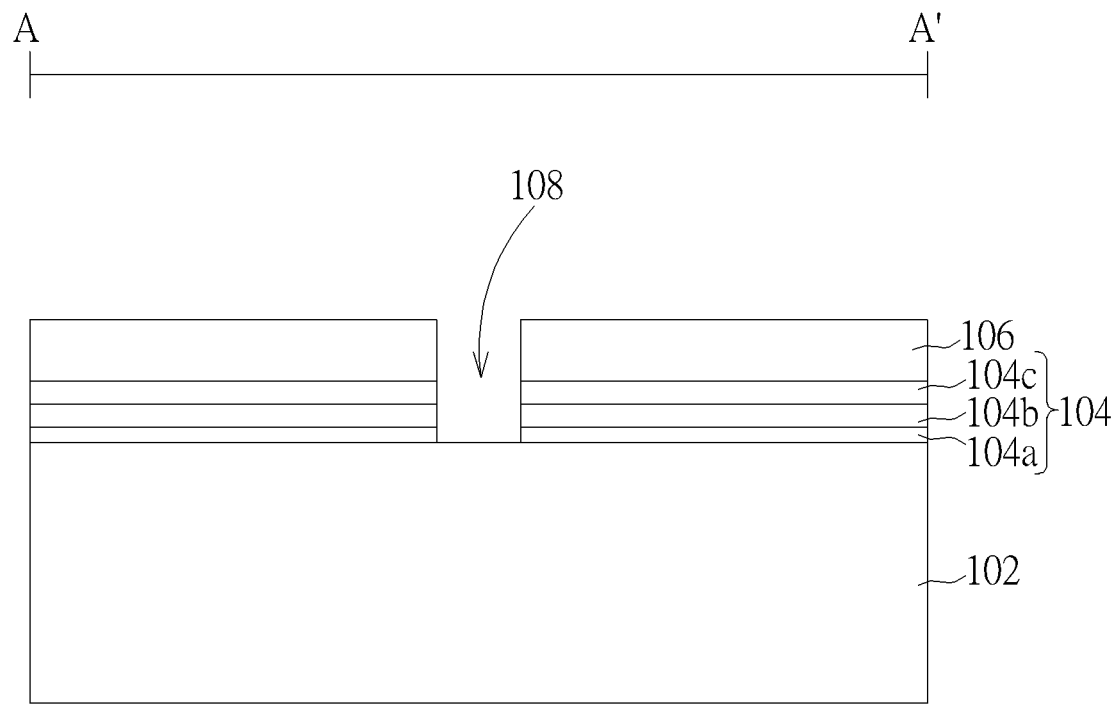
Figure 4:
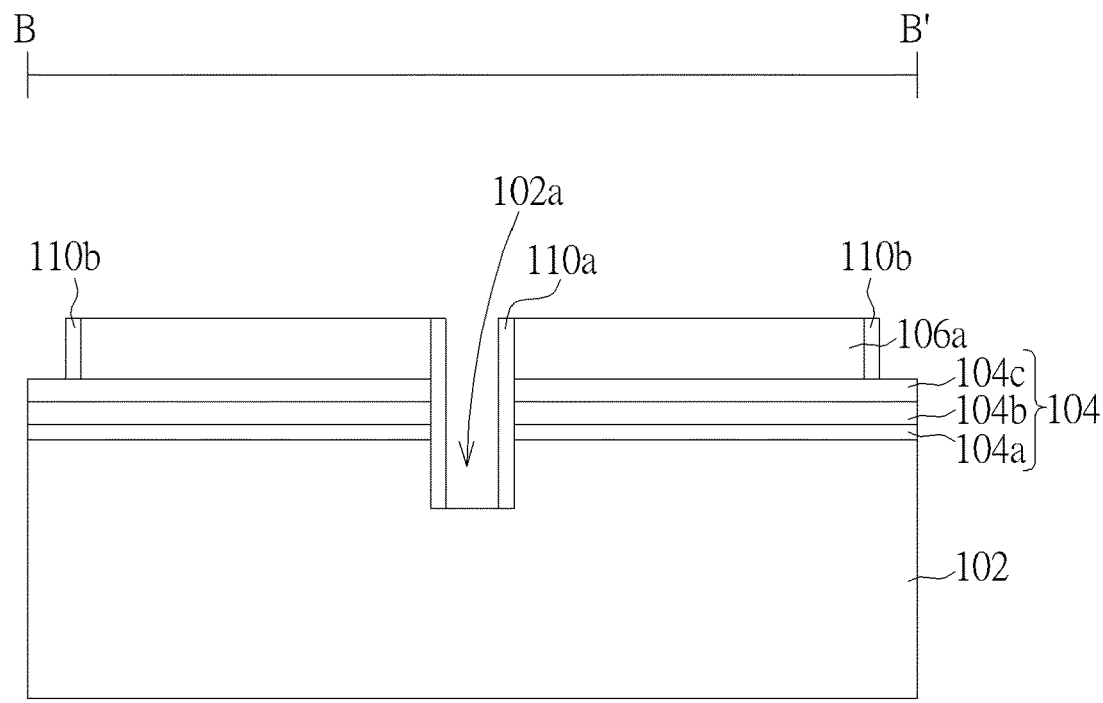
Figure 5:
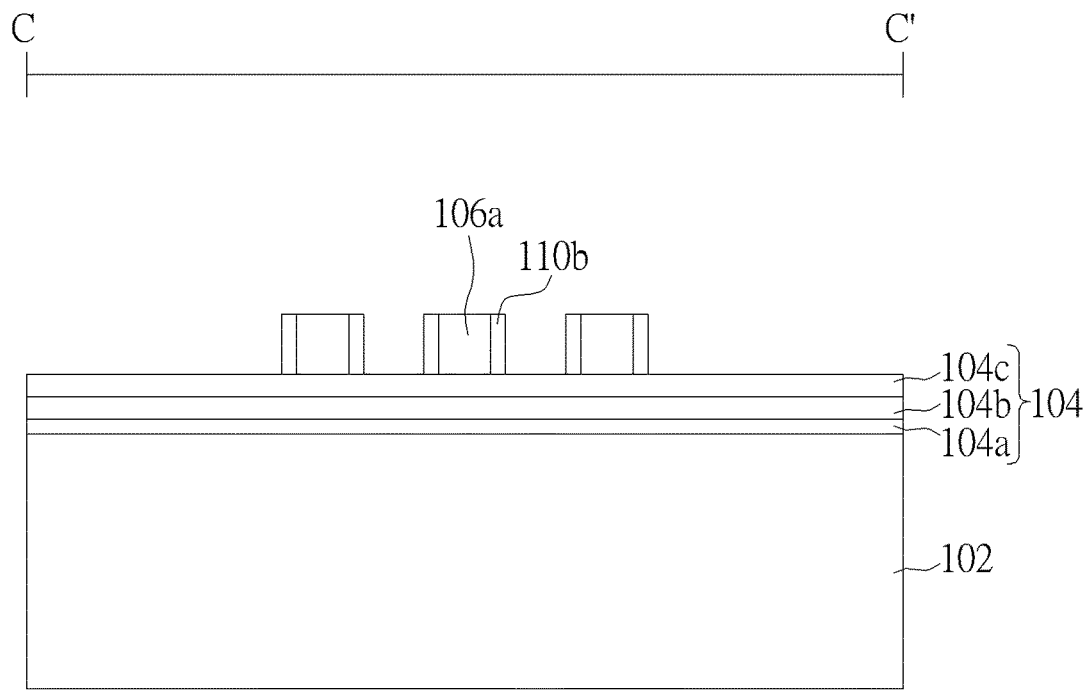

Refer to FIG. 1 through FIG. 18, which are schematic diagrams illustrating a method for fabricating a semiconductor device having a gate structure according to a first embodiment of the present invention, in which FIG. 2 is a schematic diagram illustrating a cross-sectional view of FIG. 1 taken along cross-sectional line A-A'; FIG. 4 and FIG. 5 are schematic diagrams illustrating cross-sectional views of FIG. 3 taken along a cross-sectional line B-B' and a cross-sectional line C-C' respectively; FIG. 7 and FIG. 8 are schematic diagrams illustrating cross-sectional views of FIG. 6 taken along a cross-sectional line D-D' and a cross-sectional line E-E' respectively; FIG. 10 and FIG. 11 are schematic diagrams illustrating cross-sectional views of FIG. 9 taken along a cross-sectional line F-F' and a cross-sectional line G-G' respectively; and FIG. 17 and FIG. 18 are schematic diagrams illustrating cross-sectional views of FIG. 16 taken along a cross-sectional line H-H' and a cross-sectional line I-I' respectively. As shown in FIG. 1 and FIG. 2, a substrate 102 is provided first. The substrate 102 may be a semiconductor substrate, for example a silicon substrate, a substrate including silicon or a silicon-on-insulator (SOI) substrate, but the present invention is not limited thereto. Then, a hard mask layer 104 and a mandrel layer 106 are sequentially deposited on the substrate, such that the hard layer 104 and the mandrel layer 106 are stacked on the substrate 100 sequentially. In this embodiment, the hard mask layer 104, which may be for example a single layer structure or multilayer structure, is used to shield and prevent the substrate 102 under the hard mask layer 104 from being etched while patterning the mandrel layer 106 and forming the spacer. For example, the hard mask layer 104 may include a multilayer structure formed by stacking a silicon oxide layer 104a, a silicon nitride layer 104b, a silicon oxide layer 104c in order, but the present invention is not limited herein. Additionally, the mandrel layer 106 may be for example a layer including silicon, such as a polysilicon layer or an amorphous silicon layer. Accordingly, an enough etching selectivity ratio between the mandrel layer 106 and the hard mask layer 104 can be generated in a specific etching process, but the present invention is not limited thereto. Subsequently, a first lithography process and a first etching process are performed to form a cutting trench 108 in the mandrel layer 106 and the hard mask layer 104, and the cutting trench 108 penetrates through the mandrel layer 106 and the hard mask layer 104 and exposes the substrate 102. The mandrel layer 106 includes two mandrel regions disposed at two sides of the cutting trench 108. In this embodiment, the first etching process has the ability to etch silicon, silicon oxide and silicon nitride, so that a part of the mandrel layer 104 and a part of hard mask layer 106 can be removed in the first etching process, but the present invention is not limited herein. In another variant, the first etching process may include performing two etching processes sequentially to etch the mandrel layer and the hard mask layer in order and form the cutting trench. Or, the first etching process may perform a plurality of etching processes to etch mandrel layer and different material layers between the mandrel layer and the substrate. Furthermore, the cutting trench 108 of this embodiment extends along a first direction D1, but the present invention is not limited thereto.

Figure 3:
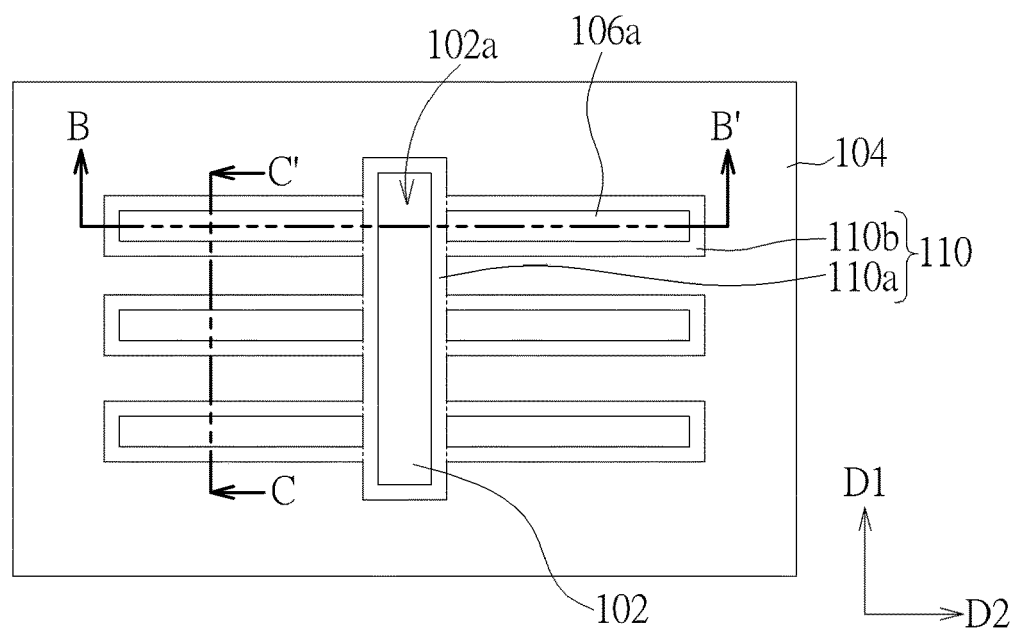

As shown in FIG. 3 and FIG. 5, after forming the cutting trench 108, the mandrel regions are patterned to forma plurality of mandrel patterns 106a. Since the cutting trench 108 exposes the substrate 102, a part of the exposed substrate 102 is removed to form a first recess 102a on the exposed substrate 102 while patterning the mandrel regions. Accordingly, a bottom of the first recess 102a is lower than a top surface of the substrate 102. Also, because the step of patterning mandrel layer 106 doesn't damage the hard mask layer 104, the hard mask 104 corresponding to the mandrel regions and without being shielded by the mandrel patterns 106a is exposed. In this embodiment, the mandrel patterns 106a are stripe-shaped patterns and extend from the two sides of the cutting trench 108 along the second direction D2. The shape of the mandrel patterns of the present invention is not limited herein. Furthermore, the step of patterning the mandrel layer 106 of this embodiment can only use a second lithography process and a second etching process, but the present invention is not limited thereto. In another variant, the step of patterning mandrel layer also uses a double patterning process or a multiple patterning process and is performed as a photolithography-photolithography-etch (2P1E) approach or a photolithography-etch-photolithography-etch (2P2E) approach, but the present invention is not limited herein.

Later, a spacer material layer is deposited to cover the mandrel patterns 106a, the exposed hard mask layer 104 and the exposed substrate 102. Then, a first etching back process is performed entirely to remove the spacer material layer on the mandrel patterns 106a and form a spacer on sidewalls of the mandrel patterns 106a and a sidewall of the first recess 102a, in which a width of the spacer 110 is smaller than a width of each mandrel pattern 106a in the first direction D1, preferably smaller than a critical width that the lithographic machine can achieve. In this embodiment, the spacer 110 can be divided into a first spacer portion 110a and a plurality of second spacer portions 110b. The first spacer portion 110a is disposed on the sidewall of the first recess 102a and the sidewalls of the mandrel patterns 106a facing the first recess 102a. Each second spacer portion 110b is disposed on other sidewalls of each mandrel pattern 106a. It is noted that since the cutting trench 108 is formed before forming the mandrel patterns 106a, the first recess 102a is formed before forming the spacer 110, and the first spacer portion 110a can be formed on the sidewall of the first recess 102a.

Figure 6:
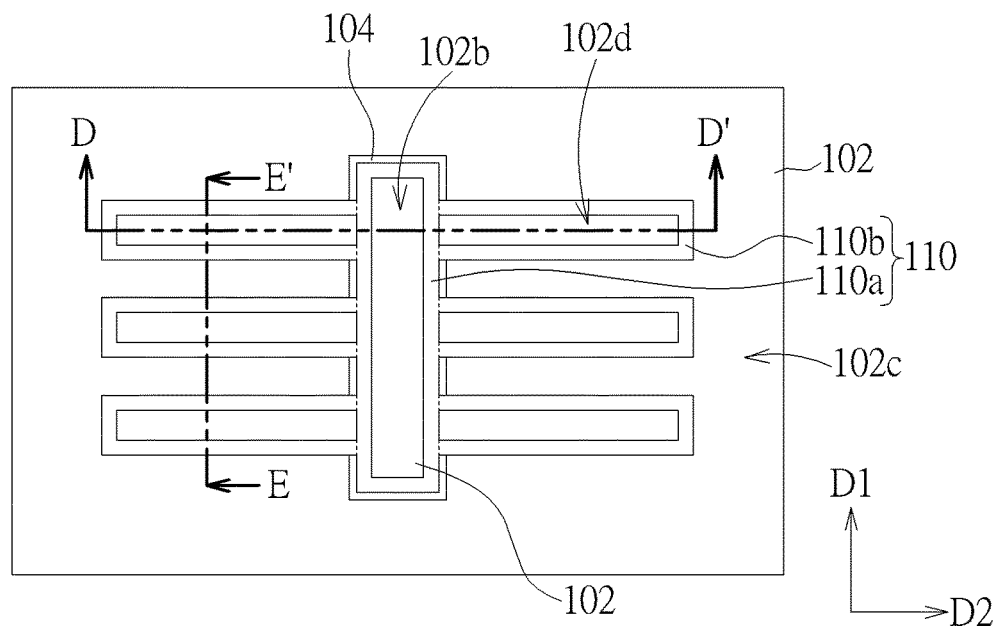
Figure 7:
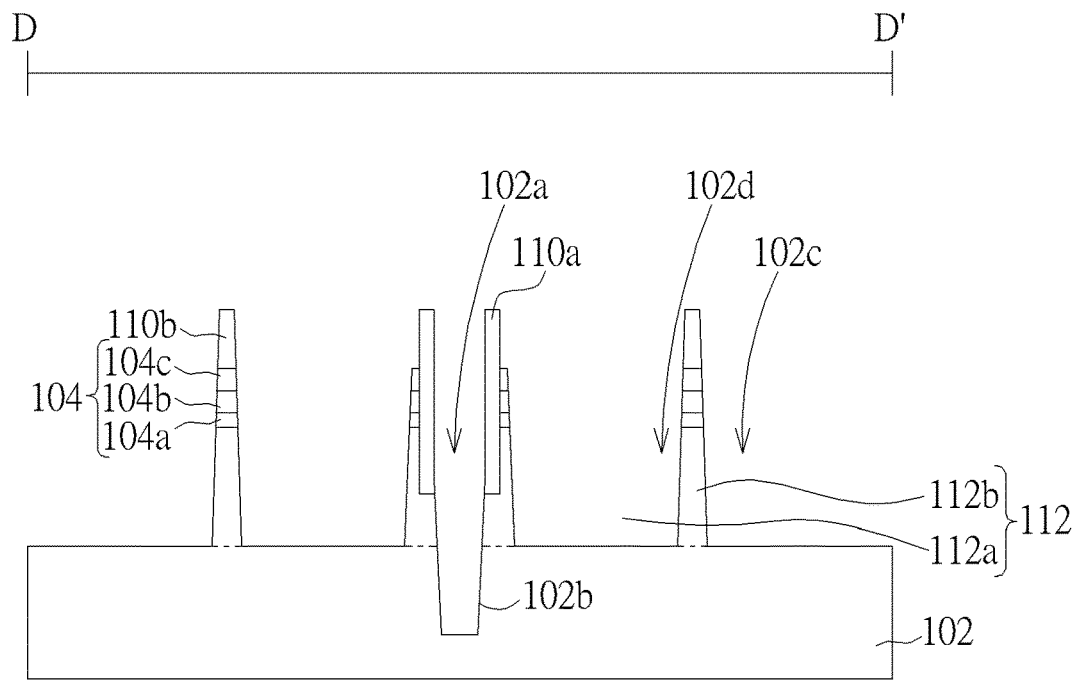
Figure 8:
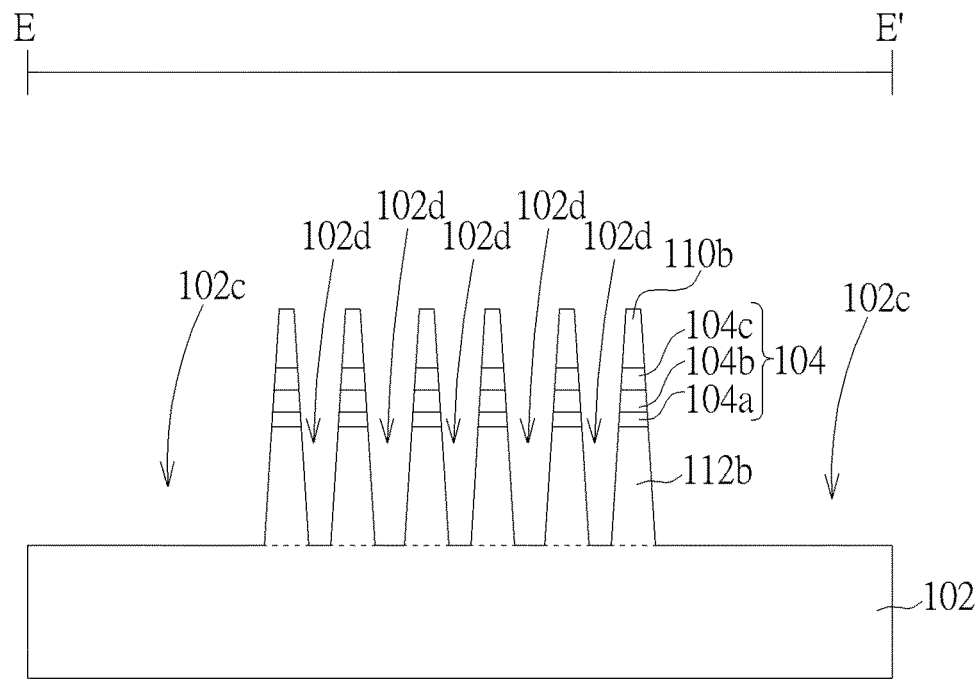

As shown in FIG. 6 through FIG. 8, the mandrel layer 106 is then removed. After that, a third etching process is performed, using the spacer 110 as a mask, to form a second recess 102b under the first recess 102a and transfer a pattern of the spacer 110 to the substrate 102 so as to form a patterned protrusion 112, in which a pattern of the patterned protrusion 112 substantially has the pattern of the spacer 110. Accordingly, the patterned protrusion 112 includes a first protrusion portion 112a corresponding to the first spacer portion 110a and a plurality of second protrusion portion 112b corresponding to the second spacers 110b respectively. Specifically, the substrate 102 disposed at the bottom of the first recess 102a and without being shielded by the first spacer portion 110a is removed to form the second recess 102b, and at the same time, the hard mask layer 104 and the substrate 102 without being shielded by the second spacer portions 110b and the first spacer portion 110a are also removed to form a third recess 102c and a plurality of fourth recesses 102d, such that the substrate 102 includes the second recess 102b, the third recess 102c and the fourth recesses 102d. The first protrusion portion 112a surrounds the second recess 102b, each second protrusion portion 112b and a part of the first protrusion portion 112a surround and form each fourth recess 102d, and the third recess 102c surrounds the patterned protrusion 112. Since the bottom of the first recess is lower than the top surface of the substrate 102 outside the first recess 102a before performing the third etching process, a depth of the third recess 102c or a depth of the fourth recess 102d formed by the third etching process is smaller than a sum of a depth of the second recess 102b and a depth of the first recess 102a.

In this embodiment, the third etching process has the ability to etch silicon, silicon oxide and silicon nitride, so that a part of the hard mask layer 104 and a part of substrate 102 can be removed in the third etching process, but the present invention is not limited thereto. In another variant, the third etching process may include two etching steps to sequentially etch the hard mask layer and the substrate. Or, the third etching process can include a plurality of etching steps to etch the hard mask layer and the substrate.

It should be noted that since the first spacer portion 110a is disposed on the sidewall of the first recess 102a before performing the third etching process, the substrate 102 under the first spacer portion 110a would not be removed. Accordingly, a width of the formed second recess 102b is smaller than a width of the first recess 102a, and a bottom and a sidewall of the second recess 102b and the bottom of the first recess 102a can form a step structure. Furthermore, because an outer sidewall of the first spacer portion 110a has another part of the hard mask layer 104 and another part of the substrate 102 disposed thereon, a part of the another part of the substrate 102 on the outer sidewall of the first spacer portion 110a can remain after performing the third etching process of this embodiment through controlling the etching conditions, such as etching time or etching rate, and preferably, a part of the another part of the hard mask layer 104 on the outer sidewall of the first spacer portion 110a may further remain.

Figure 9:
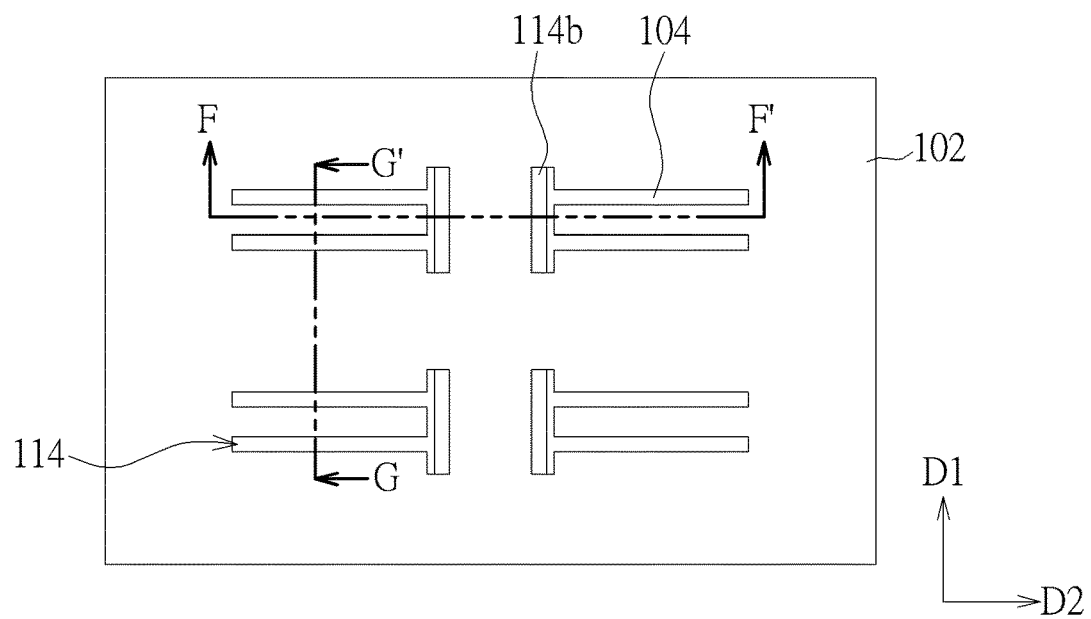
Figure 10:
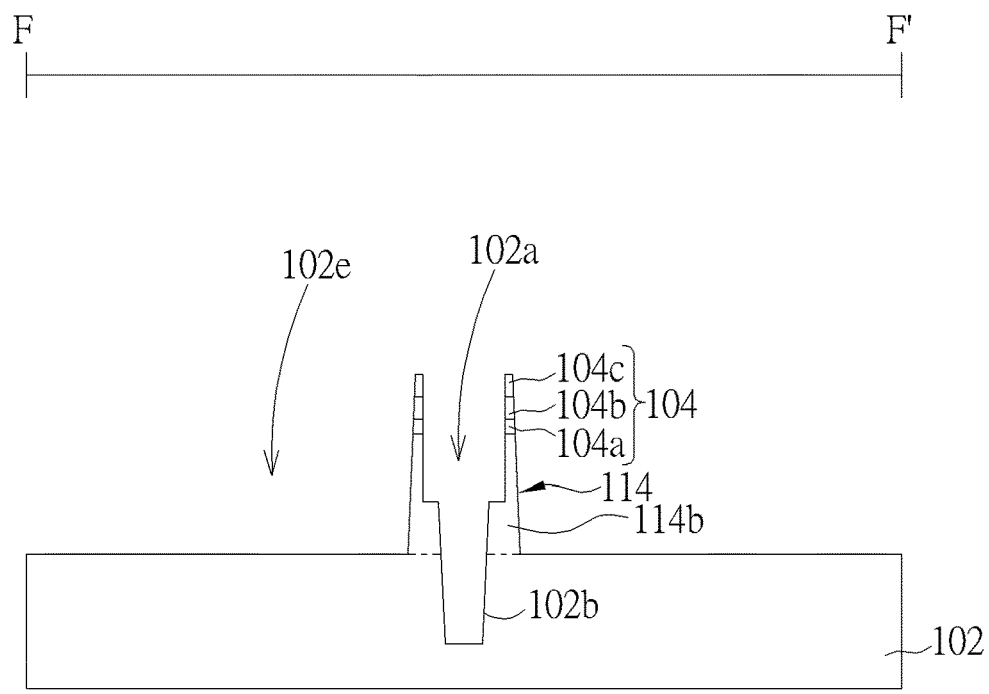
Figure 11:
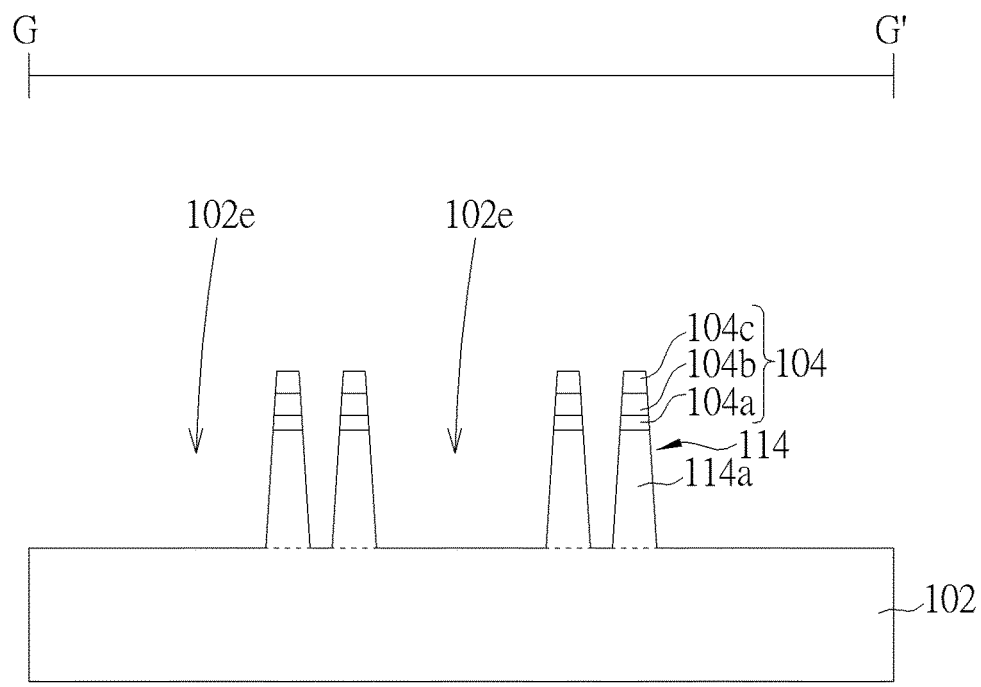

As shown in FIG. 9 through FIG. 11, after performing the third etching process, the spacer 110 is removed. Then, a fin structure cutting process is performed to remove a part of the patterned protrusion 112 and form a plurality of fin structures 114. In this embodiment, each fin structure 114 includes two fin portions 114a and a connecting portion 114b. In each fin structure 114, the connecting portion 114b connects an end of one of the fin portions 114a to an end of the other one of the fin portions 114a, thereby forming a "π"-like shape. The fin portion 114a is formed by performing the fin structure cutting process on the second protrusion portion 110b, and the connecting portion 114b is formed by performing the fin structure cutting process on the first protrusion portion 110a.

Figure 12:
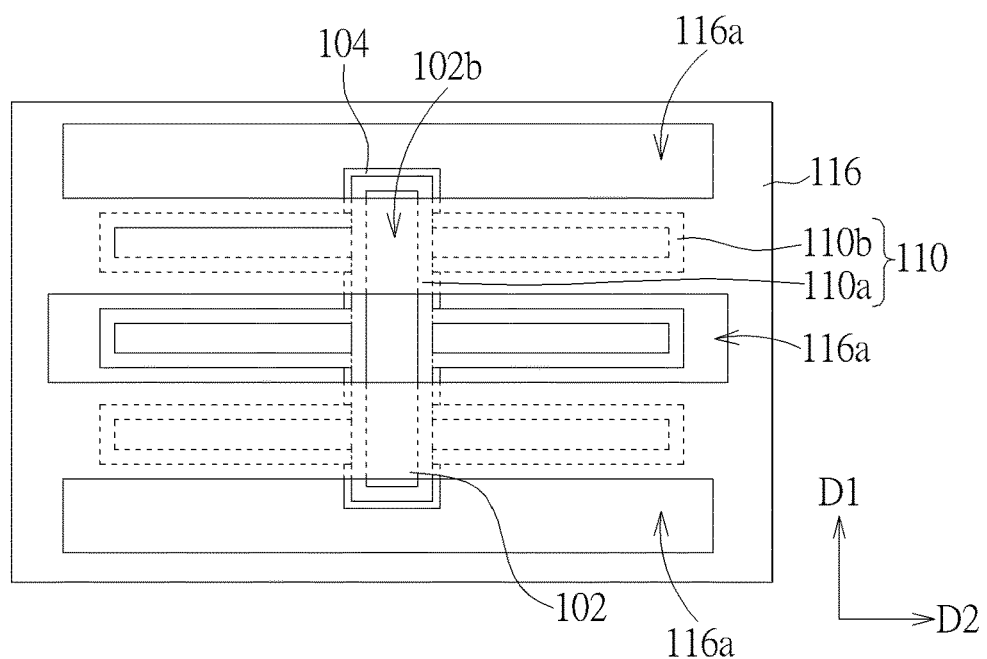

Specifically, the fin structure cutting process of this embodiment is mentioned in the following description. As shown in FIG. 12, after removing the spacer 110, a third photolithography process is performed to forma first photoresist pattern 116 on another part of the hard mask layer 104 and another part of the patterned protrusion 112, in which the first photoresist pattern 116 can be used to remove a part of the unwanted patterned protrusion 112, especially the part of the unwanted patterned protrusion 112 extending along the second direction 112. In this embodiment, the first photoresist pattern 116 has a plurality of first stripe openings 116a, and each first stripe opening 116a extends along the second direction D2. After forming the first photoresist pattern 116, a fourth etching process is performed to remove the hard mask layer 104 and the patterned protrusion 112 exposed by the first stripe openings 116a, so that the first recess 102a can be connected to the third recess 102c.

Figure 13:
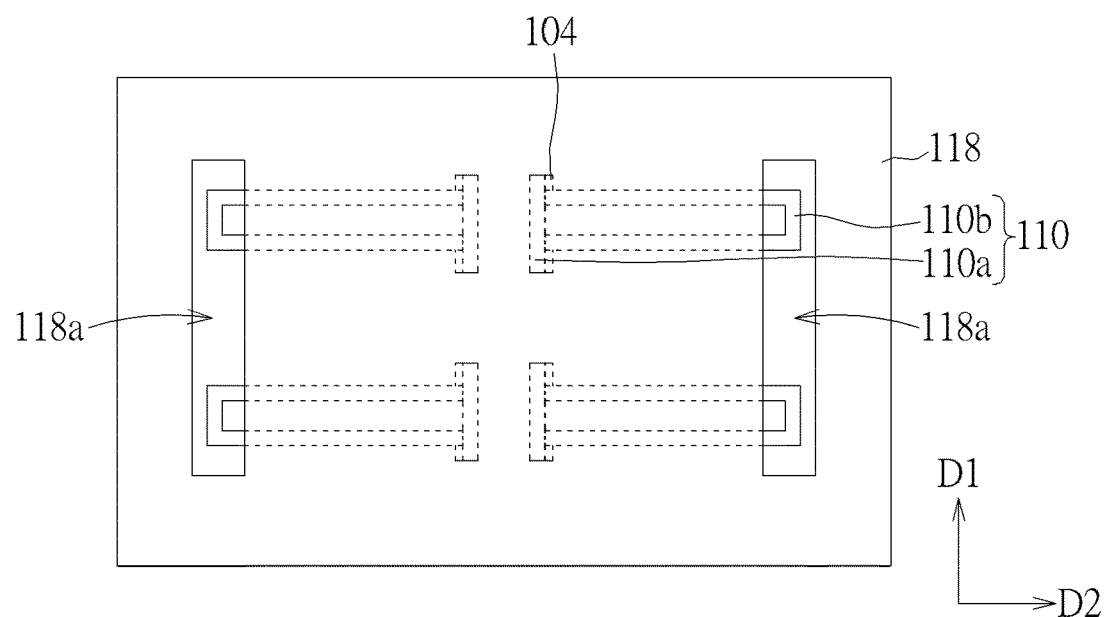

As shown in FIG. 13, after the fourth etching process, the first photoresist pattern 116 is removed, and then a second photoresist pattern 118 is formed on another part of the hard mask layer 104 and another part of the patterned protrusion 112, in which the second photoresist pattern 118 can be used to remove another part of the unwanted patterned protrusion 112, especially the another part of the unwanted patterned protrusion 112 extending along the first direction D1. In this embodiment, the second photoresist pattern 118 has a plurality of second stripe openings 118a, and each second stripe opening 118a extends along the first direction D1. After that, a fifth etching process is performed to remove the hard mask layer 104 and the patterned protrusion 112 exposed by the second stripe openings 118a and form the fin structures 114, so that the third recess 102c can be connected to the fourth recess 102d, thereby forming a shallow trench 102e.

The fin structure cutting process of the present invention is not limited to the above-mentioned description. In another variant, the step of forming the first photoresist pattern and the step of forming the second photoresist pattern can be exchanged. Or, the fin structure cutting process may utilize a double patterning process or a multiple patterning process to form the first stripe openings and the second stripe openings in the same photoresist pattern, and then, the etching process is performed to form the fin structures.

Figure 14:
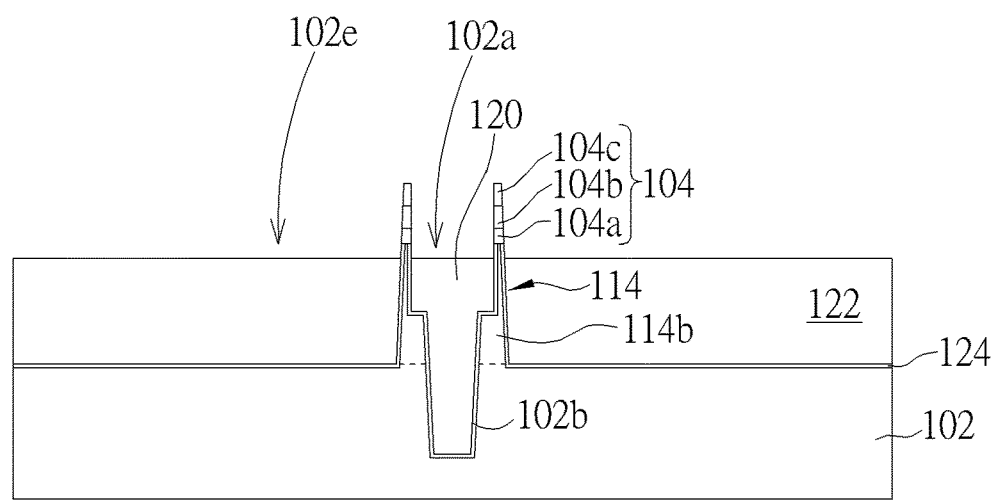
Figure 15:
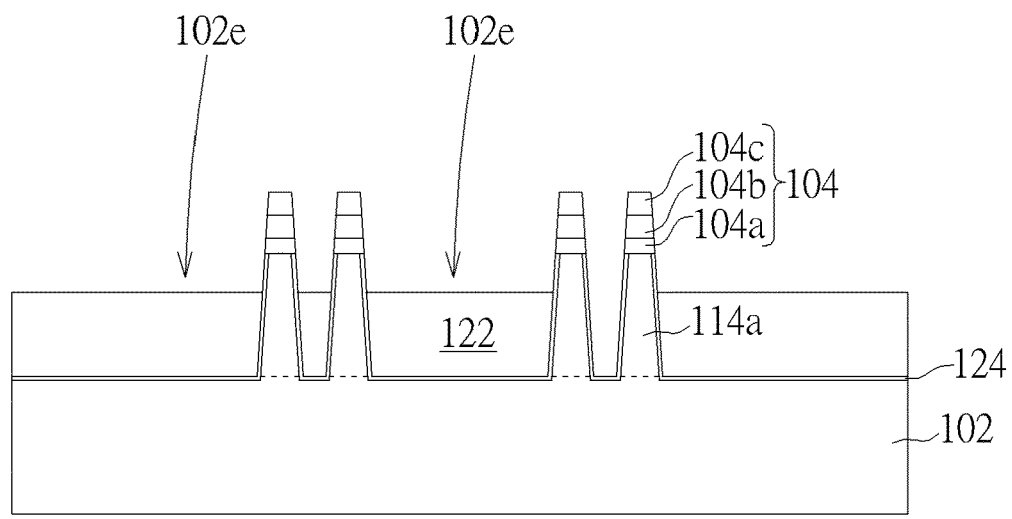

As shown in FIG. 14 and FIG. 15, after forming the fin structures 114, an insulating material is formed to entirely cover the hard mask layer on the fin structures 114 and the substrate 102, in which the first recess 102a, the second recess 102b and the shallow trench 102e are filled up with the insulating material. In this embodiment, the insulating material is preferable formed by a flowable chemical vapor deposition (FCVD) process, so that the insulating material can easily fill the first recess 102a, the second recess 102b and the shallow trench 102e. Next, a second etching back process is entirely performed, using the hard mask 104 as a mask, to remove the insulating material outside the first recess 102a, the second recess 102b and the shallow trench 102e, form a first insulating structure 120 in the second recess 102b, and form a second insulating structure 122 that is so-called shallow trench isolation (STI) in the shallow trench 102e. In this embodiment, the step of removing the insulating material can be performed until a top surface of the insulating material is between a top surface of the substrate 102 and the bottom of the first recess 102a through controlling the etching time and the etching rate, such that a top surface of the first insulating structure 120 is between the top surface of the substrate 102 and the bottom of the first recess 102a. Additionally, before forming the first insulating structure 120 and the second insulating structure 122, a liner layer 124 can be optionally formed in the substrate 102 at a sidewall and the bottom of the first recess 102a, a sidewall and a bottom of the second recess 102b and a sidewall and a bottom of the shallow trench 102. The liner layer 124 may be for example a single layer or multilayer structure, preferably include a dielectric material, such as silicon oxide or suitable material with high dielectric constant. The method for forming the liner layer 124 may include for example using an in situ steam generation (ISSG) technology, so the liner layer 124 can be formed uniformly on the surface of the exposed substrate 102, but the present invention is not limited thereto. In another variant, the liner layer also may be formed by deposition. Accordingly, the liner layer is formed on the sidewall and the bottom of the first recess, the sidewall and the bottom of the second recess and the sidewall and the bottom of the shallow trench. The liner layer also can be a single layer or multilayer structure, and the multilayer structure includes different dielectric materials. Furthermore, the liner layer disposed on the first insulating structure and the second insulating structure may be removed as well as the insulating material in the second etching back process, but the present invention is not limited herein. Or, the liner layer optionally includes other dielectric materials.

Figure 16:
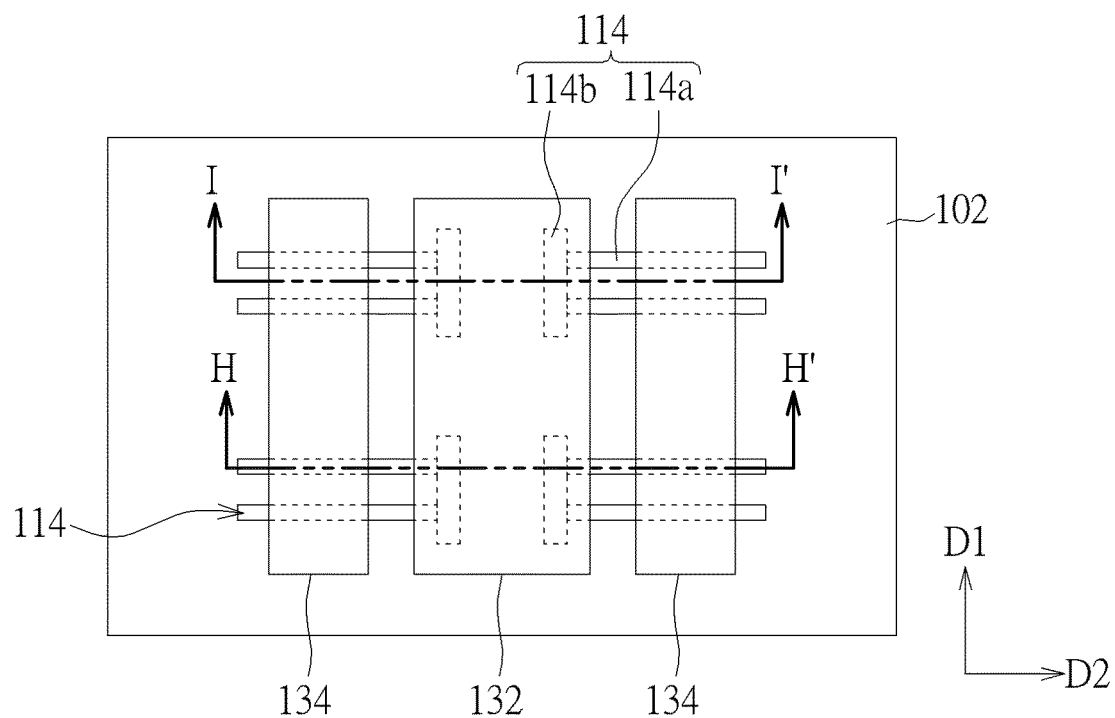
Figure 17:
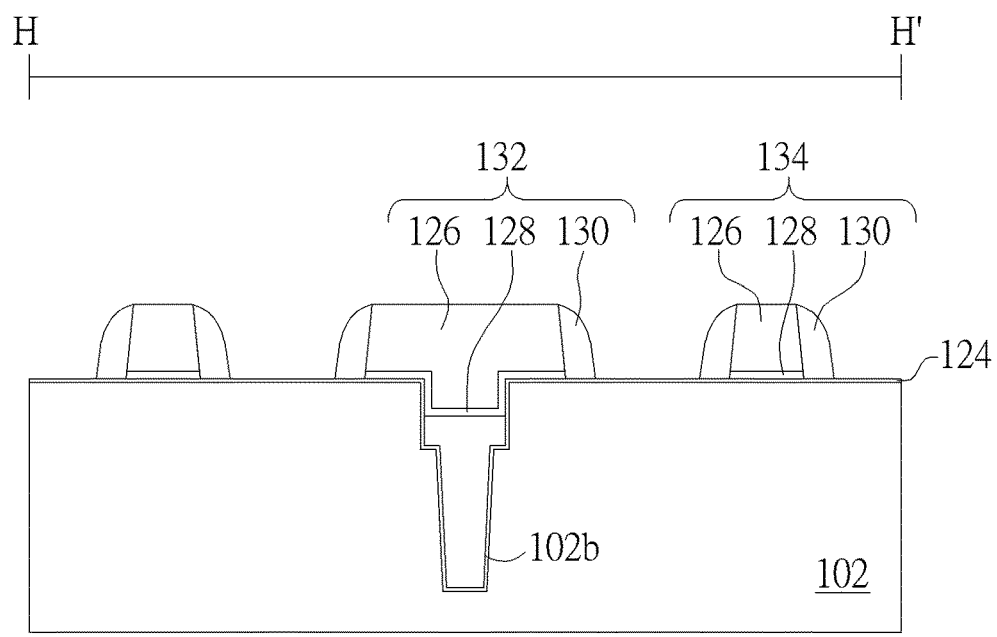
Figure 18:
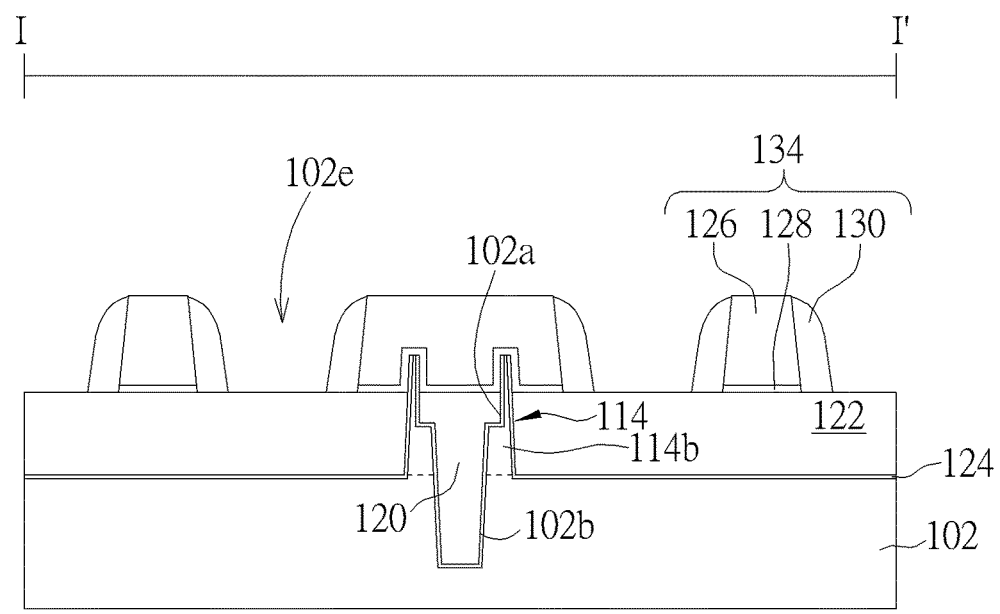

As shown in FIG. 16 through FIG. 18, after forming the first insulating structure 132 and the second insulating structure 134, the remaining hard mask layer 104 can be optionally removed according to different structure characteristics of the transistor devices and is followed by performing a gate process to form a gate dielectric material layer, such as an insulating material including silicon oxide, and a gate layer in order. Then, the gate layer and the gate dielectric layer are patterned to form the gate 126 and the gate dielectric layer 128, which is followed by forming a spacer 130 on sidewalls of the gate 126 and the gate dielectric layer 128. Accordingly, a first gate structure 132 and a plurality of second gate structures 134 are formed on the fin structures 114, in which the first gate structure 132 and each second gate structure 134 include the gate 126 and the gate dielectric layer 128 respectively. The semiconductor device 100 having the gate structure of this embodiment is completed. In this embodiment, the gates of the first gate structure 132 and the second gate structure 134 may be for example polysilicon gates but not limited thereto, and can be determined according to requirements. The spacer 130 may include for example silicon nitride, silicon oxynitride or silicon carbonitride. In other embodiments, after forming the spacer, a source/drain selective epitaxial growth (SEG) process, a metal silicide process, a contact etch stop layer process or a replacement metal gate (RMG) process can be further performed. Since the above steps are similar to the traditional method for forming transistors, the above steps are not detailed redundantly.

In this embodiment, the first gate structure 132 covers the first recess 102a and the second recess 102b and extends to cover the connecting portions 114b of the fin structures 114, thereby preventing the fin structures 114 from being affected by the following processes, such as source/drain selective epitaxial growth process. Accordingly, the deformation of structure, leakage current or bad electrical performance of the fin structures 114 resulted from the following processes can be avoided. Also, each second gate structure 134 crosses each fin portion 114b of each fin structure 114, thereby serving as the gate of the transistor.

It should be noted that since the width of the second recess 102b is smaller than the width of the first recess 102a, the width of the first insulating structure 120 in the second recess 102b is also reduced. Accordingly, the transistors disposed at two sides of the first insulating structure 120 can have a smaller gap therebetween, thereby increasing the density of the transistors in the semiconductor device 100.

The semiconductor device having the gate structure of the present invention is not limited to the above-mentioned embodiment. The following description continues to detail the other embodiments or variants, and in order to simplify and show the difference between the other embodiments or variants and the above-mentioned embodiment, the same numerals denote the same components in the following description, and the same parts are not detailed redundantly.

Figure 19:
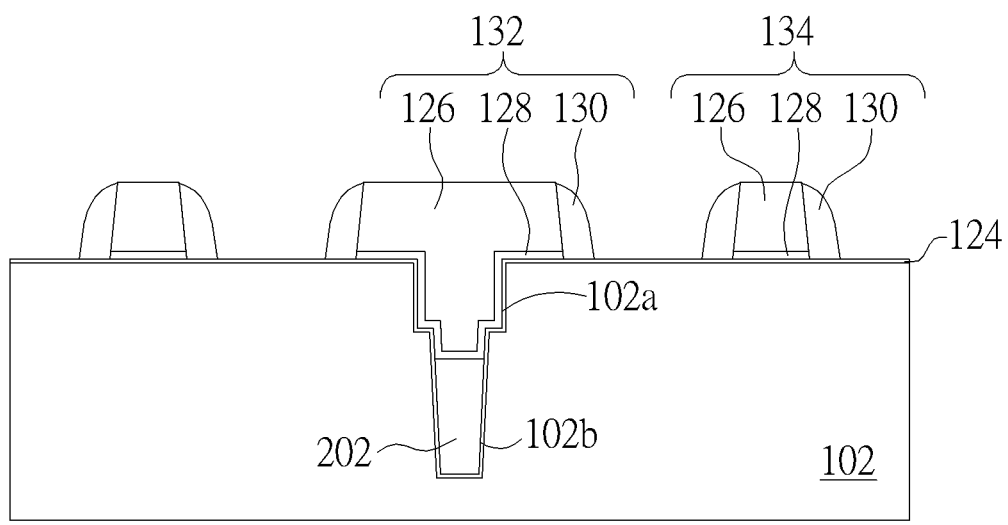
FIG. 19 is a schematic diagram illustrating a method for fabricating a semiconductor device having a gate structure according a second embodiment of the present invention.

Refer to FIG. 19 together with FIG. 1 through FIG. 13. FIG. 19 is a schematic diagram illustrating a method for fabricating a semiconductor device having a gate structure according a second embodiment of the present invention. As shown in FIG. 19, as compared with the first embodiment, the method for fabricating the semiconductor device 200 of this embodiment performs the step of removing the insulating material until the top surface of the insulating material is between the bottom of the first recess 102a and the bottom of the second recess 102b, so that the top surface of the first insulating structure 202 is between the bottom of the first recess 102a and the bottom of the second recess 102b. Since the steps before removing the insulating material in this embodiment are the same as the steps in first embodiment, as shown in FIG. 1 through FIG. 13, and the steps after removing the insulating material in this embodiment are also the same as the steps in the first embodiment, the steps are not detailed redundantly.

According to the above-mentioned description, in the method for fabricating the semiconductor device of the present invention, since the cutting trench is formed before forming the mandrel patterns, the first spacer portion can be formed on the sidewall of the first recess. Accordingly, the width of the formed second recess can be smaller than the width of the first recess, and the width of the first insulating structure formed in the second recess can be reduced. Thus, the transistors disposed at two sides of the first insulating structure can have a smaller gap therebetween, thereby increasing the density of the transistors in the semiconductor device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a substrate comprising at least two fin structures protruding from a top surface of the substrate, the substrate comprising a first recess and a second recess under the first recess, and the first recess and the second recess being disposed between the fin structures, wherein a width of the first recess is larger than a width of the second recess, and the first recess and the second recess form a step structure;
a first insulating structure filling the second recess; and
a gate structure disposed on the first insulating structure, wherein the first recess and the second recess are filled up with the gate structure and the first insulating structure.

2. The semiconductor device according to claim 1, wherein a top surface of the first insulating structure is between a top surface of the substrate and a bottom of the first recess.

3. The semiconductor device according to claim 1, wherein a top surface of the first insulating structure is between a bottom of the first recess and a bottom of the second recess.

4. The semiconductor device according to claim 1, wherein the substrate further comprises a shallow trench surrounding the fin structures, and a depth of the shallow trench is smaller a sum of a depth of the first recess and a depth of the second recess.

5. The semiconductor device according to claim 4, further comprising a second insulating structure disposed in the shallow trench.

6. The semiconductor device according to claim 1, wherein each fin structure comprises two fin portions and a connecting portion, and in each fin structure, the connecting portion connects an end of one of the fin portions to an end of the other one of the fin portions.

* * * * *